United States Patent
Li et al.

(10) Patent No.: US 11,545,590 B2
(45) Date of Patent: Jan. 3, 2023

(54) SOLAR CELL, METHOD FOR PRODUCING SAME AND SOLAR MODULE

(71) Applicants: ZHEJIANG JINKO SOLAR CO., LTD., Zhejiang (CN); JINKO SOLAR CO., LTD., Jiangxi (CN)

(72) Inventors: Wenqi Li, Zhejiang (CN); Jie Yang, Zhejiang (CN); Xinyu Zhang, Zhejiang (CN); Hao Jin, Zhejiang (CN)

(73) Assignees: ZHEJIANG JINKO SOLAR CO., LTD., Zhejiang (CN); JINKO SOLAR CO., LTD., Jiangxi (CN)

( * ) Notice: Subject to any disclaimer, the term of this patent is extended or adjusted under 35 U.S.C. 154(b) by 0 days.

(21) Appl. No.: 17/203,743

(22) Filed: Mar. 16, 2021

(65) Prior Publication Data

US 2022/0271179 A1 Aug. 25, 2022

(30) Foreign Application Priority Data

Feb. 23, 2021 (CN) .......................... 202110204252.6

(51) Int. Cl.
*H01L 31/0216* (2014.01)
*H01L 31/068* (2012.01)
(Continued)

(52) U.S. Cl.
CPC .... *H01L 31/0543* (2014.12); *H01L 31/02167* (2013.01); *H01L 31/0682* (2013.01); *H01L 31/1868* (2013.01)

(58) Field of Classification Search
CPC ........... H01L 31/1868; H01L 31/02167; H01L 31/02168
See application file for complete search history.

(56) References Cited

U.S. PATENT DOCUMENTS

2008/0042176 A1 2/2008 Rhodes
2008/0202577 A1* 8/2008 Hieslmair ........... H01L 31/0504
136/258
(Continued)

FOREIGN PATENT DOCUMENTS

CN 103367467 A 10/2013
CN 104900722 A * 9/2015
(Continued)

OTHER PUBLICATIONS

Machine translation of CN-104900722-A, Zhang Yibo et al. (Year: 2015).*

(Continued)

*Primary Examiner* — Mayla Gonzalez Ramos
(74) *Attorney, Agent, or Firm* — USCH Law, PC

(57) ABSTRACT

A solar cell, a method for producing a solar cell, and a solar module are provided. The solar cell includes: an N-type substrate and a P-type emitter formed on a front surface of the substrate; a first passivation layer, a second passivation layer and a third passivation layer sequentially formed over the front surface of the substrate and in a direction away from the P-type emitter, and a passivated contact structure disposed on a rear surface of the substrate. The first passivation layer includes a first Silicon oxynitride ($SiO_xN_y$) material, where x>y. The second passivation layer includes a first silicon nitride ($Si_mN_n$) material, where m>n. The third passivation layer includes a second silicon oxynitride ($SiO_iN_j$) material, where a ratio of $i/j \in [0.97, 7.58]$.

15 Claims, 6 Drawing Sheets

(51) Int. Cl.
*H01L 31/054* (2014.01)
*H01L 31/18* (2006.01)

(56) References Cited

U.S. PATENT DOCUMENTS

| | | | |
|---|---|---|---|
| 2010/0059114 A1 | 3/2010 | Park et al. | |
| 2010/0258168 A1 | 10/2010 | Yu et al. | |
| 2010/0258177 A1 | 10/2010 | Ko et al. | |
| 2011/0123907 A1* | 5/2011 | Yau | H01G 11/86 |
| | | | 429/232 |
| 2011/0140226 A1* | 6/2011 | Jin | H01L 31/068 |
| | | | 257/466 |
| 2018/0204962 A1* | 7/2018 | Choi | H01L 31/02168 |
| 2019/0027619 A1* | 1/2019 | Kai | H01L 31/02167 |
| 2021/0217907 A1* | 7/2021 | Chen | H01L 31/1804 |

FOREIGN PATENT DOCUMENTS

| | | |
|---|---|---|
| CN | 104900722 A | 9/2015 |
| CN | 211654833 U | 10/2020 |
| JP | 2004335867 A | 11/2004 |
| JP | 2009049443 A | 3/2009 |
| JP | 5019397 B2 | 9/2012 |
| JP | 2015103598 A | 6/2015 |
| JP | 2015122435 A | 7/2015 |
| JP | 2016103642 A | 6/2016 |
| JP | 2017504186 A | 2/2017 |
| JP | 6788144 B1 | 11/2020 |
| WO | 2017187623 A1 | 11/2017 |

OTHER PUBLICATIONS

Zhejiang Jinko Solar Co., Ltd. et al., JP First Office Action, 2021-044493, dated Jun. 10, 2021, 6 pgs.
Zhejiang Jinko Solar Co., Ltd., et al., Extended European Search Report, EP 21162375.6, dated Sep. 8, 2021, 10 pgs.
J. Dupuis et al., "Impact of PECVD SiON stoichiometry and post-annealing on the silicon surface passivation," Thin Solid Films, Elsevier, Amsterdam, NL, vol. 516, No. 20, Aug. 30, 2008, 5 pgs.
Anishkumar Soman et al., "Broad range refractive index engineering of SixNy and SiOxNy thin films and exploring their potential applications in crystalline silicon solar cells," Materials Chemistry and Physics, vol. 197, 2017, 11 pgs.

* cited by examiner

SOLAR CELL, METHOD FOR PRODUCING SAME AND SOLAR MODULE

CROSS-REFERENCE TO RELATED APPLICATION

The present application claims the benefit of priority to Chinese Patent Application No. 2021102042526 filed on Feb. 23, 2021, which is incorporated herein by reference in its entirety.

TECHNICAL FIELD

Embodiments of the present disclosure relate to the semiconductor field, in particular to a solar cell, a method for producing the solar cell and a solar module.

BACKGROUND

An interface recombination is a key factor that inhibits improvement of efficiency of a solar cell. A passivation technique can be used to reduce the interface recombination. For the passivation of the solar cell, a plasma enhanced chemical vapor deposition (PECVD) method is often used to grow a layer of silicon nitride film on a surface of a silicon substrate of the solar cell. By adjusting the refractive indexes of different silicon nitride films, an optimal interface passivation effect and light antireflection effect can be achieved. However, the silicon nitride material has a relatively large amount of fixed positive charges and may be widely applied to a surface of a phosphorus diffusion layer and non-diffusion layer of a P-type solar cell, but be rarely applied to a boron diffusion layer of an N-type solar cell.

In order to solve this problem(s), an aluminum oxide film with fixed negative charges is introduced. When the aluminum oxide film is deposited on the surface of the phosphorus diffusion layer of the P-type solar cell, the fixed negative charges may be provided to address passivate interface defects of the solar cell, so as to improve the passivation effect of the solar cell. However, for the N-type solar cell, a deposition of the aluminum oxide film on the boron diffusion layer of the N-type silicon substrate may cause a higher interface state defect density, and the field passivation effect of the aluminum oxide can be weakened. Thus the passivation of the N-type solar cell needs to be improved by a subsequent process, such as an electrical annealing process. The annealing process and corresponding annealing equipment required for the passivation of the aluminum oxide film undoubtedly increase the manufacture cost and the preparation time of the N-type solar cell, the quality control of the solar cell may be further affected. Therefore, it is desired to develop a high efficient N-type solar cell with a non-aluminum oxide passivation system.

SUMMARY

Embodiments of the present disclosure provide a solar cell, a method for producing the solar cell and a solar module. The solar cell adopts a non-aluminum oxide passivation system.

In one aspect of the present disclosure, a solar cell may be provided. The solar cell may include: an N-type substrate and a P-type emitter formed on a front surface of the substrate; a first passivation layer, a second passivation layer and a third passivation layer sequentially formed over the front surface of the substrate and in a direction away from the P-type emitter; and a passivated contact structure disposed on a rear surface of the substrate. In some embodiments, the first passivation layer includes a first silicon oxynitride ($SiO_xN_y$) material, where x>y. The second passivation layer includes a first silicon nitride ($Si_mN_n$) material, where m>n. The third passivation layer includes a second silicon oxynitride ($SiO_iN_j$) material, where a ratio of $i/j \in [0.97, 7.58]$.

In some embodiments, the first passivation layer has a thickness of 8 nm~20 nm in a direction perpendicular to the substrate.

In some embodiments, the second passivation layer has a thickness of 40 nm~60 nm in a direction perpendicular to the substrate.

In some embodiments, the third passivation layer has a thickness not greater than 50 nm in a direction perpendicular to the substrate.

In some embodiments, the third passivation layer has a thickness of 10 nm~20 nm in the direction perpendicular to the substrate.

In some embodiments, a second refractive index of the second passivation layer is greater than both a first refractive index of the first passivation layer and a third refractive index of the third passivation layer.

In some embodiments, the first refractive index is 1.61~1.71, the second refractive index is 1.98~2.2 and the third refractive index is 1.56~1.87.

In some embodiments, a first ratio of x/y is 1.53~2.58, and a second ratio of m/n is 3.12~5.41.

In some embodiments, the second passivation layer is composed of a plurality of sub-layers, and refractive indexes of the plurality of sub-layers increase in a direction of the second passivation layer toward the substrate.

In some embodiments, the solar cell includes a fourth passivation layer on a surface of the passivated contact structure away from the substrate. The fourth passivation layer includes a second silicon nitride ($Si_aN_b$) material, where a ratio of $a/b \in [3.82, 6.37]$.

In some embodiments, a refractive index of the fourth passivation layer is 2.04~2.2, and the fourth passivation layer has a thickness of 60 nm~100 nm in a direction perpendicular to the rear surface of the substrate.

In some embodiments, the fourth passivation layer is composed of a plurality of sub-layers, and refractive indexes of the plurality of sub-layers increase in a direction of the fourth passivation layer toward the substrate.

In a second aspect of the present disclosure, a solar module may be provided. The solar module may include at least one solar cell. The at least one solar cell each includes: an N-type substrate and a P-type emitter formed on a front surface of the substrate; a first passivation layer, a second passivation layer and a third passivation layer sequentially formed over the front surface of the substrate and in a direction away from the P-type emitter; and a passivated contact structure disposed on a rear surface of the substrate. The first passivation layer includes a first silicon oxynitride ($SiO_xN_y$) material, where x>y. The second passivation layer includes a first silicon nitride ($Si_mN_n$) material, where m>n. The third passivation layer includes a second silicon oxynitride ($SiO_iN_j$) material, where a ratio of $i/j \in [0.97, 7.58]$.

In some embodiments, the first passivation layer has a thickness of 8 nm~20 nm in a direction perpendicular to the substrate. In some embodiments, the second passivation layer has a thickness of 40 nm~60 nm in a direction perpendicular to the substrate. In some embodiments, the third passivation layer has a thickness not greater than 50 nm in a direction perpendicular to the substrate. In some embodiments, the third passivation layer has a thickness of 10 nm~20 nm in the direction perpendicular to the substrate. In some embodiments, a second refractive index of the second passivation layer is greater than both a first refractive index of the first passivation layer and a third refractive index of the third passivation layer. In some embodiments, the first refractive index is 1.61~1.71, the second refractive index is 1.98~2.2 and the third refractive index is 1.56~1.87. In some embodiments, a first ratio of x/y is 1.53~2.58, and a second ratio of m/n is 3.12~5.41. In some embodiments, the second passivation layer is composed of a plurality of sub-layers, and refractive indexes of the plurality of sub-layers increase in a direction of the second passivation layer toward the substrate. In some embodiments, the solar cell further includes: a fourth passivation layer on a surface of the passivated contact structure away from the substrate. The fourth passivation layer includes a second silicon nitride ($Si_aN_b$) material, where a ratio of a/b $\in$[3.82, 6.37].

In a third aspect of the present disclosure, a method for producing a solar cell may be provided. The method may include: providing an N-type substrate and a P-type emitter formed on a front surface of the substrate; sequentially forming a first passivation layer, a second passivation layer and a third passivation layer over the front surface of the substrate and in a direction away from the P-type emitter; and forming a passivated contact structure on a rear surface of the substrate. The first passivation layer includes a first silicon oxynitride ($SiO_xN_y$) material, where x>y. The second passivation layer includes a first silicon nitride ($Si_mN_n$) material, where m>n. The third passivation layer includes a second silicon oxynitride ($SiO_iN_j$) material, where a ratio of i/j$\in$[0.97, 7.58].

In some embodiments, before the second passivation layer is formed, ammonia gas is introduced into a reaction chamber and ionized, so as to implant hydrogen ions to the first passivation layer, where a flow rate of the ammonia gas is 6000 sccm~8000 sccm, an introducing duration of the ammonia gas is 5 min~10 min, and a radio frequency power applied to the ionizing is 4000 W~8000 W.

In some embodiments, after the hydrogen ions are implanted, the first passivation layer is subjected to a photo-thermal annealing treatment; where a annealing temperature of the photo-thermal annealing treatment is 150° C.~400° C., a light intensity of the photo-thermal annealing treatment is 1~6 times sunlight intensity, and an annealing duration of the photo-thermal annealing treatment is 1 min~6 min.

In some embodiments, nitrogen ions and the hydrogen ions are implanted to the first passivation layer in a same process step, wherein a nitrogen ion concentration of a first region neighboring a first surface of the first passivation layer away from the substrate is greater than a nitrogen ion concentration of a second region neighboring a second surface opposite to the first surface.

In some embodiments, the first passivation layer and the second passivation layer are formed by using a same process equipment.

BRIEF DESCRIPTION OF THE DRAWINGS

One or more embodiments are described as examples with reference to the corresponding figures in the accompanying drawings. The figures in the accompanying drawings do not constitute a proportion limitation unless otherwise stated.

DETAILED DESCRIPTION

In order to make the objectives, technical solutions and advantages of the embodiments of the present disclosure clearer, embodiments of the present disclosure will be described in detail below with reference to the accompanying drawings. However, those skilled in the art may appreciate that, in the various embodiments of the present disclosure, numerous technical details are set forth in order to provide the reader with a better understanding of the present disclosure. However, the technical solutions claimed in the present disclosure may be implemented without these technical details and various changes and modifications based on the following embodiments.

Figure 1:
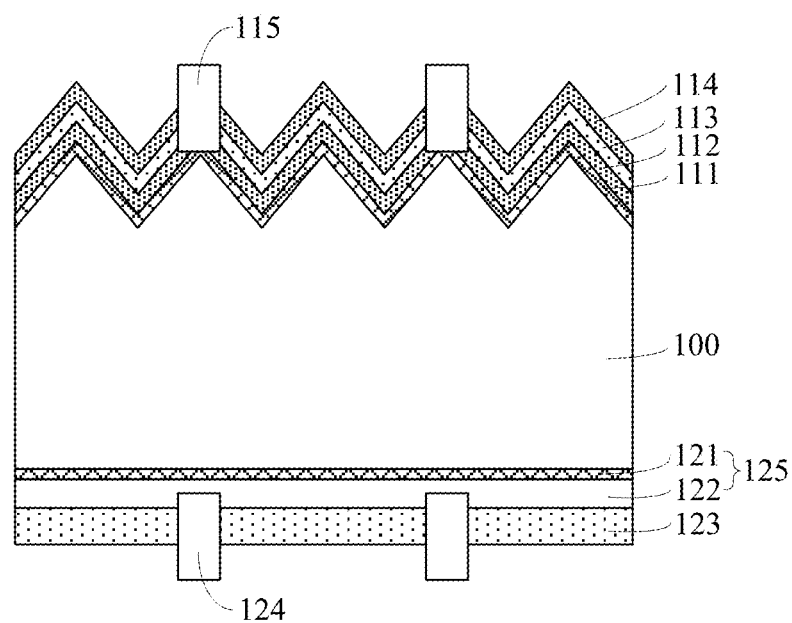
FIG. 1 shows a solar cell according to some embodiments of the present disclosure.

Referring to FIG. 1, a solar cell may be provided. The solar cell includes: an N-type substrate 100 and a P-type emitter 111 formed on a front surface of the substrate 100; a first passivation layer 112, a second passivation layer 113 and a third passivation layer 114 sequentially formed over the front surface of the substrate 100 and in a direction away from the P-type emitter 111, and a passivated contact structure 125 formed on a rear surface of the substrate 100. The first passivation layer 112 includes a first silicon oxynitride ($SiO_xN_y$) material, where x>y. The second passivation layer 113 includes a first silicon nitride ($Si_mN_n$) material, where m>n. The third passivation layer 114 includes a second silicon oxynitride ($SiO_iN_j$) material, where a ratio of i/j$\in$ [0.97, 7.58].

In some embodiments, the substrate 100 is a silicon substrate doped with N-type ions (for example, group V elements such as phosphorus). In some embodiments, a resistivity of the substrate 100 ranges from 0.1~10 ohm·cm, preferably, 0.3~2 ohm·cm. As used herein, the front surface of the substrate 100 refers to a surface of the substrate 100 facing the sunlight, and the rear surface of the substrate 100 refers to a surface of the substrate 100 facing away from the sunlight. The front surface and the rear surface are opposite for the substrate 100. The P-type emitter 111 is at least formed at a region neighboring a surface of the substrate 100 facing the sunlight. In some embodiments, the P-type emitter 111 may be designated as a portion of the substrate 100. The diffusion resistance of the P-type emitter 111 may have a range of 110Ω~140Ω. The P-type emitter 111 is doped with P-type ions (for example, group III elements such as boron). In some embodiments, the surface diffusion concentration of the P-type ions may be set to E19~E20/cm³. It should be understood that the N-type substrate 100 and the P-type emitter 111 may form a PN junction of the solar cell. The PN junction may be configured to produce carriers upon receipt of the incident light.

The substrate material includes but limited to a monocrystalline silicon, a polycrystalline silicon, an amorphous silicon, or a microcrystalline silicon. In other embodiments, the substrate material may also be selected from a carbon-based material, an organic material, or multi-component compounds. In some embodiments, the multi-component compounds include gallium arsenide, cadmium telluride, copper indium diselenide, or the like, or any combination thereof.

In some embodiments, the first passivation layer 112 includes the first silicon oxynitride ($SiO_xN_y$) material. Since both the first passivation layer 112 and the substrate 100 include silicon material, the first passivation layer 112 and the substrate 100 have similar material properties. Thus, it is conducive to reducing the interface state defect density between the P-type emitter 111 and the first passivation layer 112, improving a transmission efficiency of photo-generated carriers, reducing a stress applied to the substrate 100 by the first passivation layer 112, so as to avoid stress damage to the substrate 100, and ensure that the solar cell has a high photoelectric conversion efficiency. Moreover, the silicon oxynitride material has a good texturing surface coverage, as well as a chemical passivation effect and field passivation effect, which is conducive to improving the passivation effect of the laminated passivation structure.

Due to the requirement of forbidden band width of material, a semiconductor material or a material with material characteristics similar to the semiconductor material is generally used for the substrate 100. In some cases, if a metal compound (such as aluminum oxide) is used for the material of the first passivation layer 112, it is likely that the first passivation layer 112 applies great stress to the substrate 100. The stress damage may be caused because the material properties of the first passivation layer 112 are quite different from that of the substrate 100. It is not conducive to the generation and transmission of photo-generated carriers, and the improvement of the photoelectric conversion efficiency of the solar cell.

The silicon oxynitride material has advantages of adjustable refractive index and adjustable electrical properties. Specifically, the refractive index of the first silicon oxynitride material may be adjusted so that the refractive index of the first passivation layer 112 better match with with the second passivation layer 113 and the third passivation layer 114, thereby reducing the light reflection loss caused by poor refractive index matching (for example, a relatively large refractive index difference between the passivation layers). The light absorption loss may be minimized. In addition, the electric intensity of the first silicon oxynitride ($SiO_xN_y$) material may be adjusted in order to ensure that there is a small charge repulsion between the first passivation layer 112 and the P-type emitter 111. The first passivation layer 112 and the P-type emitter 111 at the surface of the N-type substrate 100 (for example, the P-type emitter 111 can be formed by boron diffusion process) can be better matched. The first passivation layer 112 can bring a good passivation effect.

In some embodiments, for the first silicon oxynitride ($SiO_xN_y$) material of the first passivation layer 112, a ratio of the number of oxygen atoms and the number of nitrogen atoms, that is, x/y, is referred as a first ratio, where x denotes the number of oxygen atoms, y denotes the number of nitrogen atoms. The electric intensity and the refractive index of the first passivation layer 112 may be adjusted by controlling a value of the first ratio.

In some embodiments, the first ratio may be set to be 1.5~3, optionally, 1.53~2.58, such as 1.86, 2.13, or 2.35, so that the first silicon oxynitride can exhibit weak electropositivity, thus surface charges of the first passivation layer 112 exhibits weak electropositivity or even neutrality. When the surface charges of the first passivation layer 112 exhibits weak electropositivity, the first passivation layer 112 has less influence on the field passivation effect of the second passivation layer 113. The first passivation layer 112 has a good band bending effect, which is conducive to reducing the recombination rate of carriers on the front surface of the substrate 100, thereby improving the photoelectric conversion efficiency. Besides, a repulsive force formed between the P-type emitter 111 and the first passivation layer 112 is relatively weak due to the same charge polarity, and the first passivation layer 112 may better match with the surface of the N-type substrate 100. That is, the bonding force between the first passivation layer 112 and the substrate 100 is stronger, the interface state defect density between the first passivation layer 112 and the substrate 100 is lower, and the first passivation layer 112 has higher uniformity. Moreover, since the first passivation layer 112 exhibits electropositivity, it helps to block positive ions migrating from module packaging materials (such as plastic and glass), to prevent the positive ions from migrating to the surface of the substrate 100, thereby inhibiting the PID phenomenon of the solar cell and improving the performance of the solar module.

When an edge of the solar module is affected with damp, a large amount of freely moving $Na^+$ may be generated in the glass of the packaging material of the solar module, and $Na^+$ ions may pass through the packaging material and migrate to the surface of the solar cell. In some cases, when the aluminum oxide is used for the first passivation layer 112, since the polarity of charges carried by the aluminum oxide is opposite to the polarity of $Na^+$ ions, the first passivation layer 112 may be unable to block the further migration of $Na^+$ ions. Therefore, the $Na^+$ ions may further migrate to the surface of the substrate 100 and destroy the PN junctions, resulting in power attenuation and reduction of the photoelectric conversion efficiency of the solar cell. In some embodiments, when the first silicon oxynitride material is used for the first passivation layer 112, the whole first passivation layer 112 exhibits electropositivity. In this way, a principle of homogeneity repulsion may be practicable to block the migration of $Na^+$ ions, i.e., prevent $Na^+$ ions from gathering on the surface of the substrate 100, thereby ensuring the passivation effect of the first passivation layer 112 and the second passivation layer 113, and improving the photoelectric conversion efficiency of the solar cell.

In some embodiments, by adjusting the first ratio, the first silicon oxynitride material as well as the first passivation layer 112 may have a relatively large first refractive index. In this way, when the third passivation layer 114 is subsequently formed, the first refractive index of the first passivation layer 112 may be greater than a third refractive index of the third passivation layer 114, or close to the third refractive index, thereby increasing an utilization efficiency of incident light and the photoelectric conversion efficiency of the solar cell. Accordingly, under the premise of ensuring the utilization efficiency of incident light, the third refractive index of the third passivation layer 114 has a relatively large optional range, which is conducive to selecting more kinds of materials of the third passivation layer 114, and adjusting the third refractive index of the third passivation layer 114 flexibly, so that the third passivation layer 114 may be further matched with the second passivation layer 113. In this way, absorption performance of different wavelengths of sunlight of the solar cell is optimized, and the short-circuit current and cell efficiency of the solar cell are improved.

In some embodiments, when the first ratio is 1.5~3, the first refractive index of the first passivation layer 112 may be set to 1.61~1.71, such as 1.63, 1.66 or 1.69.

A thickness of the first passivation layer 112 relates to the passivation effect and the utilization efficiency of incident light of the first passivation layer 112. The amount of positive charges carried by the first passivation layer 112 may be changed by adjusting the thickness of the first passivation layer 112, thereby changing the matching degree between the first passivation layer 112 and the P-type emitter 111, and changing the repelling force of the first passivation layer 112 to the positive ions migrated outside of the first passivation layer 112. The passivation effect of the first passivation layer 112 can be controlled accordingly. In addition, by adjusting the thickness of the first passivation layer 112, the stress applied by the first passivation layer 112 to the substrate 100 may be changed, so as to change the interface state defect density between the first passivation layer 112 and the substrate 100. The greater the interface state defect density, the stronger the light trapping ability and the lower the utilization efficiency of the incident light.

In some embodiments, in a direction perpendicular to the front surface of the N-type substrate 100, the thickness of the first passivation layer 112 may be set to 8 nm~20 nm, for example, 12 nm, 15 nm, or 18 nm. When the thickness of the first passivation layer 112 is in the range of 8 nm~20 nm, it is not only conducive to avoiding excessive positive charges in the first passivation layer 112 and ensuring that the first passivation layer 112 has a good field passivation effect for the P-type emitter 111, but also conducive to avoiding too less positive charges in the first passivation layer 112 and ensuring that the first passivation layer 112 has a good repelling effect on the migrated positive ions, thereby inhibiting the PID phenomenon. Moreover, it is conducive to controlling the stress between the first passivation layer 112 and the substrate 100 within a reasonable range, which not only ensures the effective bonding between the first passivation layer 112 and the substrate 100, but also reduces the stress damage to the substrate 100 and interface state defects due to the stress damage, thereby improving the utilization efficiency of frontal incident light as well as the generation efficiency and transmission efficiency of carriers, and improving the photoelectric conversion efficiency of the solar cell.

The second passivation layer 113 includes a first silicon nitride ($Si_mN_n$) material. For the first silicon nitride ($Si_mN_n$) material, a ratio of the number of silicon atoms and the number of nitrogen atoms, that is, m/n, is referred as a second ratio, where m denotes the number of silicon atoms, n denotes the number of nitrogen atoms. The electric intensity and the refractive index of the second passivation layer 113 may be adjusted by changing the second ratio. Herein, the electric intensity may be characterized by the number of positive charges carried in a unit volume. The more positive charges carried in the unit volume, the greater the electric intensity.

In some embodiments, the second ratio may be set to 3~5, optionally, 3.12~5.41, such as 3.72, 4.32, or 4.92. The silicon nitride ($Si_mN_n$) material having the certain second ratio may exhibit a strong electric intensity. It is conducive for the second passivation layer 113 to having a good hydrogen-based passivation effect, allowing the doped hydrogen ions diffuse to the front surface of the substrate 100 to reduce the carrier recombination rate. Moreover, when the second ratio m/n of the silicon nitride ($Si_mN_n$) material is set to 3~5, optionally, 3.12~5.41, such as 3.72, 4.32, or 4.92, the second passivation layer 113 has a large refractive index, which is conducive to reducing the reflection and emission of light, enhancing the absorption of visible light, and facilitating a preparation of black or dark blue solar cells to meet the requirements for black modules.

In some embodiments, the second ratio correlates with the first ratio, so that the second passivation layer 113 has a good hydrogen-based passivation effect under the influence of surface charges of the first passivation layer 112. Further, the second refractive index of the second passivation layer 113 may be set to be greater than the first refractive index and the third refractive index, in order to ensure that a whole refractive index of the first passivation layer 112 and the second passivation layer 113 is larger than that of the third passivation layer 114, thereby reducing the reflection and emission of light and improving the photoelectric conversion efficiency of the solar cell.

It should be noted that the photoelectric conversion efficiency has an upper limit. When reflected amount and emitted amount of the incident light are close to the minimum, the impact of increasing thickness is relatively small.

A thickness of the second passivation layer 113 relates to a hydrogen-based passivation effect of the second passivation layer 113. The hydrogen-based passivation effect affects the conversion efficiency of the solar cell and is also related to the manufacturing cost of the solar cell. The thicker the thickness of second passivation layer 113, the higher the manufacturing cost of the solar cell.

In some embodiments, in a direction perpendicular to the N-type substrate 100, the thickness of the second passivation layer 113 may be set to 40 nm~60 nm, such as, 45 nm, 50 nm, or 55 nm. When the thickness of the second passivation layer 113 is in the range of 40 nm~60 nm, it is conducive to ensuring that the amount of positive charges carried by the second passivation layer 113 meet the requirements for interface hydrogen passivation and reducing the interface recombination rate of the carriers. In addition, it is conducive to reducing the package size of the solar cell and the manufacturing cost.

It should be noted that the restrictions on the refractive index and thickness of the second passivation layer 113 is made for the whole second passivation layer 113. In some embodiments, the second passivation layer 113 may be a single layer or be composed of a plurality of sub-layers. Optionally, the second passivation layer 113 may be composed of 2 to 4 sub-layers. In the direction of the second passivation layer 113 toward the substrate 100, the refractive indexes of the plurality of sub-layers increase, and the refractive index of each sub-layer meets the restriction on the refractive index of the whole second passivation layer 113, which is conducive to further improving the utilization efficiency of incident light.

In some embodiments, the third passivation layer 114 includes a second silicon oxynitride ($SiO_iN_j$) material, where a third ratio i/j∈[0.97, 7.58], for example, 2.5, 5, or 6.5. The third refractive index of the third passivation layer 114 is less than the second refractive index of the second passivation layer 113, which is conducive to reducing the reflection and emission of light, enhancing the absorption of visible light, and facilitating the preparation of black or dark blue solar panel.

Further, the ratio of the third ratio (i/j) of the second silicon oxynitride ($SiO_iN_j$) material and the first ratio (x/y) of the first silicon oxynitride ($SiO_xN_y$) material may range from 0.57~4.95, such as 0.98, 1.86 or 3.67. When the ratio is less than or equal to 1, the third refractive index of the third passivation layer 114 is greater than or equal to the first refractive index of the first passivation layer 112, and the solar cell has a relatively high photoelectric conversion efficiency. When the ratio is greater than 1, the third refractive index of the third passivation layer 114 is smaller than the first refractive index of the first passivation layer 112. In this way, the reflected light or emitted light from the third passivation layer 114 may be transmitted into the substrate 100 again through the first passivation layer 112, further improving the photoelectric conversion efficiency of the solar cell.

In some embodiments, due to the requirements on matching degree of the refractive index of adjacent layers and the photoelectric conversion efficiency, the first refractive index may be set to 1.61~1.71, such as 1.63, 1.66, or 1.69, and the second refractive index may be set to 1.98~2.2, such as 2.05, 2.1, or 2.15, and the third refractive index may be set to 1.56~1.87, such as 1.61, 1.67 or 1.75. In this way, it is beneficial for the solar cell to have high photoelectric conversion efficiency. Compared with a conventional solar cell using the aluminum oxide as its passivation layer, a short-circuit current $I_{sc}$ of the solar cell disclosed in the present disclosure (e.g., FIG. 1) may be increased by 20-40 mA, which facilitate to improving the conversion efficiency of the solar cell.

A light absorption capacity of the solar cell is mainly related to the refractive index and thickness of the second passivation layer 113 as well as the refractive index and thickness of the third passivation layer 114. Since the refractive index and thickness of the second passivation layer 113 and the refractive index of the third passivation layer 114 have been determined, the thickness of the third passivation layer 114 can be set to be no greater than 50 nm, correspondingly, in order to ensure that the solar cell has a higher light absorption capacity.

Figure 2:
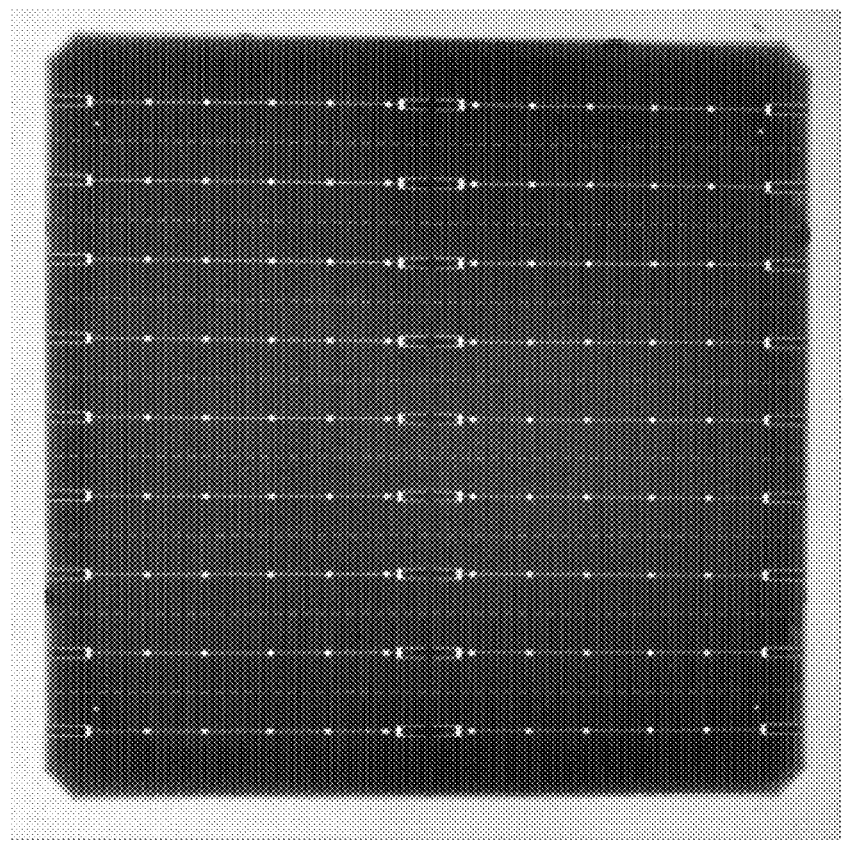
FIG. 2 and FIG. 3 show illustrative examples of solar cells according to some embodiments of the present disclosure.
Figure 3:
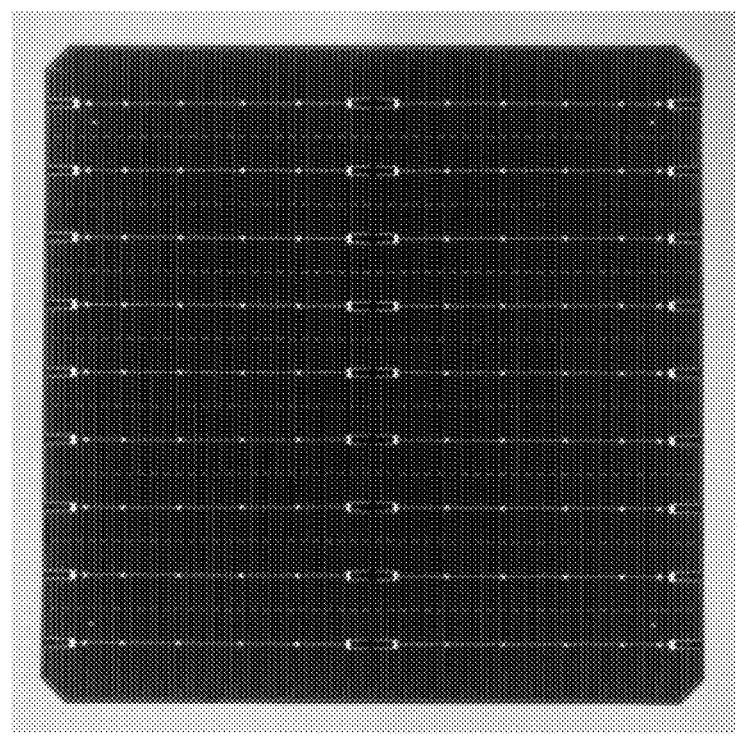

The third passivation layer 114 with different thicknesses may cause different light absorption capacities and different colors of the solar cell. In some embodiments, the third passivation layer 114 has a first thickness threshold range and a second thickness threshold range, and a maximum value of the second thickness threshold range is less than or equal to a minimum value of the first thickness threshold range. When the thickness of the third passivation layer 114 is within the first thickness threshold range, incident light is easily emitted from an edge of the third passivation layer 114, and human eyes may receive more emitted light, so that the surface of the solar cell appears bright blue color in a visible light range, as shown in FIG. 2. When the thickness of the third passivation layer 114 is within the second thickness threshold range, more incident light enters the substrate 100, and the surface of the solar cell appears dark blue color close to black color in the visible light range, and even appears black color, as shown in FIG. 3. Dark blue or black solar cells may be applicable for black solar modules.

In some embodiments, the first thickness threshold range may be 20 nm~50 nm, such as 30 nm, 37 nm or 45 nm.

In some embodiments, the second thickness threshold range may be 10 nm~20 nm, such as 13 nm, 15 nm or 17 nm.

Figure 4:
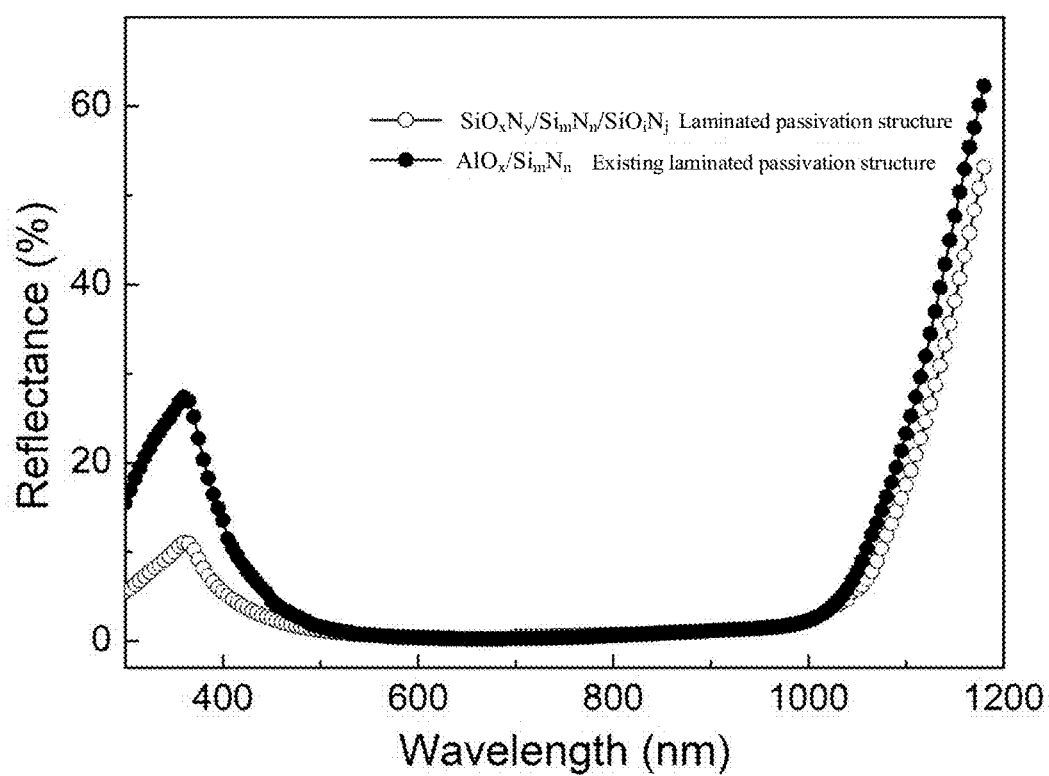
FIG. 4 shows light reflectivity of solar cells according to some embodiments of the present disclosure.

By providing the first passivation layer 112, the second passivation layer 113 and the third passivation layer 114 with the above-mentioned parameters (e.g., electropositivity, refractive index and thickness), the incidence and absorption capacity of the solar cell for sunlight in different wavelength bands may be optimized, thereby improving the short-circuit current and the cell efficiency of the solar cell. Referring to FIG. 4, compared to an existing aluminum oxide-based passivation structure, the passivation structure provided by the present disclosure (e.g., the passivation structure including the first passivation layer 112, the second passivation layer 113 and the third passivation layer 114) has a lower reflectivity for the near-ultraviolet visible light and ultraviolet light. For example, the reflectivity for the light with a wavelength of about 390 nm is decreased more than a half, dropping from about 30% to about 10%, and the provided passivation structure has higher light utilization efficiency.

In some embodiments, the passivated contact structure 125 at least includes an interface passivation layer 121 and a field passivation layer 122 sequentially formed in a direction away from the substrate 100. A material of the interface passivation layer 121 may be a dielectric material used to realize an interface passivation for the rear surface of the substrate 100. For example, the interface passivation layer 121 may be configured as a tunneling oxide layer (for example, a silicon oxide layer). A material of the field passivation layer 122 may be a material that realizes the field passivation effect, such as a doped silicon material. The doped silicon material may include but not limited to a doped polysilicon material, a doped microcrystalline silicon material or a doped amorphous silicon material. For the N-type silicon substrate 100, the field passivation layer 122 may be configured as an N-type doped polysilicon layer.

In some embodiments, a fourth passivation layer 123 is further formed on a surface of the field passivation layer 122 facing away from the substrate 100. The fourth passivation layer 123 includes a material used for anti-reflection, for example, a second silicon nitride ($Si_aN_b$) material. For the second silicon nitride ($Si_aN_b$) material of the fourth passivation layer 123, a fourth ratio of the number of silicon atoms and the number of nitrogen atoms, that is, a/b, may be set to 3~8, and further, be set to 3.82~6.37, for example, 4.32, 5.02 or 5.87; where a denotes the number of silicon atoms, b denotes the number of nitrogen atoms.

In some embodiments, a refractive index range of the fourth passivation layer 123 may be set to 2.04~2.2, such as 2.08, 2.12 or 2.16. In the direction perpendicular to the rear surface of the substrate 100, a thickness range of the fourth passivation layer 123 may be set to 60 nm~100 nm, such as 70 nm, 80 nm or 90 nm. The fourth passivation layer 123, corresponding to the refractive index range and the thickness range, may have better light absorption at the rear surface, which is conducive to ensuring that the rear surface of the substrate 100 has high light utilization efficiency.

In some embodiments, similar to the second passivation layer 113, the fourth passivation layer 123 may be composed of a plurality of sub-layers, that is, in the direction of the fourth passivation layer 123 toward the substrate 100, the refractive indexes of the plurality of sub-layers gradually increase, and the refractive index of each respective sub-layer is limited by the averaged refractive index of the fourth passivation layer 123.

In some embodiments, the solar cell further includes first electrodes 115 and second electrodes 124. The first electrodes 115 are electrically connected to the P-type emitter 111. The second electrodes 124 penetrate the fourth passivation layer 123 and are electrically connected to the field passivation layer 122. In some embodiments, the first electrodes 115 and/or the second electrodes 124 may be prepared by sintering and printing with a conductive paste (silver paste, aluminum paste, or silver-aluminum paste).

In some embodiments, by controlling a composition ratio of the first silicon oxynitride ($SiO_xN_y$) material of the first passivation layer, the first passivation layer exhibits weak electropositivity, which may reduce an influence of the silicon oxynitride on the field passivation effect of the second passivation layer, and match with the P-type emitter. Moreover, compared with the aluminum oxide, the silicon oxynitride has similar properties with the substrate, which is conducive to reducing the interface state defect density and stress damage of the P-type emitter, thereby reducing the carrier recombination rate at the front surface of the substrate, improving the short circuited circuit of the solar cell, and increasing the photoelectric conversion efficiency of the solar cell. Further, the first passivation layer with electropositivity may repel the positive ions that migrate in, avoid the migration of ions to the surface of the substrate, which is conducive to suppressing the PID phenomenon of the solar cell and improving the performance of the module. In addition, the passivation structure including the first passivation layer, the second passivation layer and the third passivation layer can be used to improve the utilization efficiency of incident light for the solar cell, especially, for the near ultraviolet visible light and the ultraviolet light of the incident light.

In addition, by providing the first passivation layer having the certain thickness, it is conducive to reducing the front light trapping loss introduced by the first passivation layer. In addition, by providing first passivation layer having the certain refractive index, the number of positive charges of the first passivation layer is kept in a proper range, which not only ensures that the first passivation layer has a good repelling effect on the migrated positive ions for inhibiting the PID phenomenon, but also ensures that the first passivation layer may be used for the surface passivation of the P-type emitter. Further, it is conducive to controlling the stress between the first passivation layer and the substrate within a reasonable range, which not only ensures the effective bonding between the first passivation layer and the substrate, but also reduces the stress damage to the substrate.

In some embodiments, a solar module may be provided. The solar module includes at least one solar cell described in connection with FIG. 1. For example, the solar module may include an N-type substrate 100 and a P-type emitter 111 formed on a front surface of the substrate 100; a first passivation layer 112, a second passivation layer 113 and a third passivation layer 114 sequentially formed on the front surface of the substrate 100 and in a direction away from the P-type emitter 111, and a passivated contact structure 125 formed on a rear surface of the substrate 100. The first passivation layer 112 includes a first silicon oxynitride ($SiO_xN_y$) material, where x>y. The second passivation layer 113 includes a first silicon nitride ($Si_mN_n$) material, where m>n. The third passivation layer 114 includes a second silicon oxynitride ($SiO_iN_j$) material, where $i/j \in [0.97, 7.58]$. The solar module has a P-type emitter and adopts a non-aluminum oxide passivation system. Compared with a combination of an N-type emitter and an aluminum oxide passivation system, the solar module disclosed in the present disclosure can have high photoelectric conversion efficiency and lowered PID phenomenon of the solar cell.

In some embodiments, the first passivation layer 112 may have a thickness of 8 nm~20 nm in a direction perpendicular to the substrate. In some embodiments, the second passivation layer 113 may have a thickness of 40 nm~60 nm in a direction perpendicular to the substrate. In some embodiments, the third passivation layer 114 may have a thickness not greater than 50 nm in a direction perpendicular to the substrate. In some embodiments, the third passivation layer 114 may have a thickness of 10 nm~20 nm in the direction perpendicular to the substrate. In some embodiments, a second refractive index of the second passivation layer 113 is greater than both a first refractive index of the first passivation layer 112 and a third refractive index of the third passivation layer 114. In some embodiments, the first refractive index may be set to 1.61~1.71, the second refractive index may be set to 1.98~2.2 and the third refractive index may be set to 1.56~1.87. In some embodiments, a first ratio of x/y may be set to 1.53~2.58, and a second ratio of m/n may be set to 3.12~5.41. In some embodiments, the second passivation layer 113 may be composed of a plurality of sub-layers, and refractive indexes of the plurality of sub-layers increase in a direction of the second passivation layer 113 toward the substrate. In some embodiments, the solar cell may further include: a fourth passivation layer 123 on a surface of the passivated contact structure away from the substrate. The fourth passivation layer 123 may include a second silicon nitride ($Si_aN_b$) material, where $a/b \in [3.82, 6.37]$. In some embodiments, a refractive index of the fourth passivation layer 123 may be set to 2.04~2.2, and the fourth passivation layer 123 may have a thickness of 60 nm~100 nm in a direction perpendicular to the rear surface of the substrate. In some embodiments, the fourth passivation layer 123 may be composed of a plurality of sub-layers, and refractive indexes of the plurality of sub-layers increase in a direction of the fourth passivation layer 123 toward the substrate 100.

In some embodiments, referring to FIGS. 5-14, a method for producing the solar cell described in connection with FIG. 1 can be provided. The method includes: providing an N-type substrate 100 and a P-type emitter 111 formed on a front surface of the substrate 100; sequentially forming a first passivation layer 112, a second passivation layer 113 and a third passivation layer 114 on the front surface of the substrate 100 and in a direction away from the P-type emitter 111; and forming a passivated contact structure 125 on a rear surface of the substrate 100. The first passivation layer 112 includes a first silicon oxynitride ($SiO_xN_y$) material, where x>y. The second passivation layer 113 includes a first silicon nitride ($Si_mN_n$) material, where m>n. The third passivation layer 114 includes a second silicon oxynitride ($SiO_iN_j$) material, where $i/j \in [0.97, 7.58]$. The solar module has a P-type emitter and adopts a non-aluminum oxide passivation system. Compared with a combination of an N-type emitter and an aluminum oxide passivation system, the solar module disclosed in the present disclosure can have high photoelectric conversion efficiency and lowered PID phenomenon of the solar cell.

In some embodiments, before the second passivation layer 113 is formed, ammonia gas is introduced into a reaction chamber (e.g., a reaction chamber of PECVD device) and ionized, so as to implant hydrogen ions to the first passivation layer 112, where a flow rate of the ammonia gas may be 6000 sccm~8000 sccm, an introducing duration of the ammonia gas may be 5 min-10 min, and a radio frequency power applied to the ionizing may be 4000 W~8000 W. In some embodiments, after the hydrogen ions are implanted, the first passivation layer 112 is subjected to a photo-thermal annealing treatment; where a annealing temperature of the photo-thermal annealing treatment may be 150° C.~400° C., a light intensity of the photo-thermal annealing treatment may be 1~6 times sunlight intensity, and an annealing duration of the photo-thermal annealing treatment may be 1 min~6 min. In some embodiments, nitrogen ions and the hydrogen ions are implanted to the first passivation layer 112 in a same process step, wherein a nitrogen ion concentration of a first region neighboring a first surface of the first passivation layer 112 away from the substrate 100 is greater than a nitrogen ion concentration of a second region neighboring a second surface opposite to the first surface. In some embodiments, the first passivation layer 112 and the second passivation layer 113 may be formed by using a same process equipment.

Figure 5:
FIG. 5 to FIG. 14 are schematic diagrams corresponding to steps for producing a solar cell according to some embodiments of the present disclosure.
Figure 6:
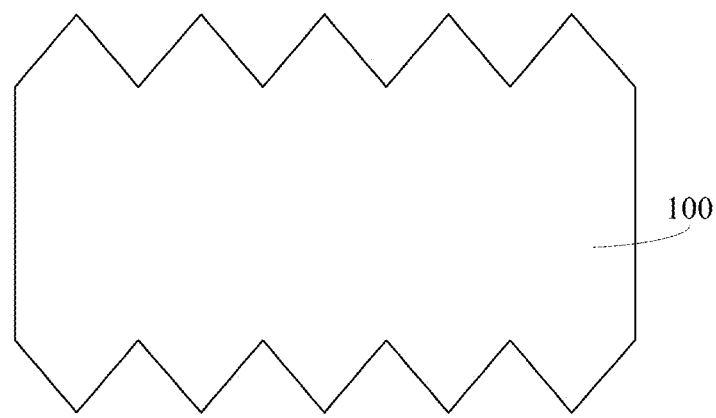

Referring to FIGS. 5 and 6, an N-type substrate 100 may be provided and the N-type substrate 100 may be double-sided textured.

In some embodiments, the N-type substrate 100 is cleaned, and a pyramid textured surface is prepared by a wet chemical etching process. The pyramid textured surface may reduce the light reflection at a surface of the substrate 100, thereby increasing the absorption and utilization of light by the substrate 100, and improving the conversion efficiency of the solar cell. In addition, a mature alkali texturing technology may be adopted for preparing the textured surface, to form a texture of 45-degree positive pyramids.

Figure 7:
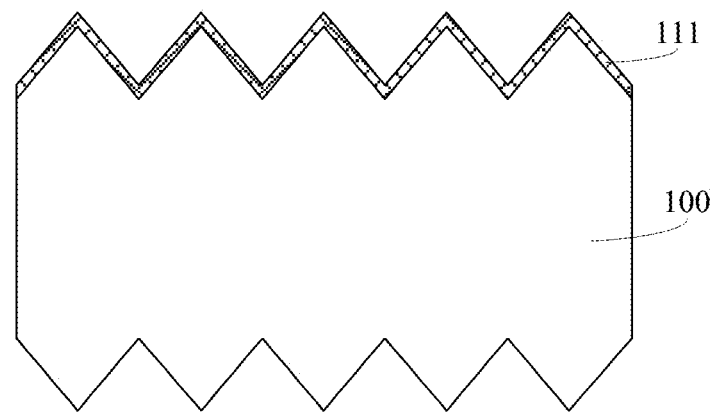

Referring to FIG. 7, a P-type emitter 111 may be formed.

After the double-sided texturing, a boron diffusion treatment is performed for a front surface of the substrate 100, in order to form the P-type emitter 111. The P-type emitter 111 occupies a portion of a surface layer at the sun-facing side of the substrate 100. The P-type emitter 111 and the substrate 100 form a PN junction of the solar cell.

In some embodiments, during the boron diffusion treatment, unwanted borosilicate glass, at the front surface, a rear surface and a side surface of the substrate 100, may be generated. The borosilicate glass has a protective effect on the substrate 100, which avoids the damage of the surface of substrate 100 caused by some processes. The unwanted borosilicate glass may be used as a mask layer for the substrate 100.

Figure 8:
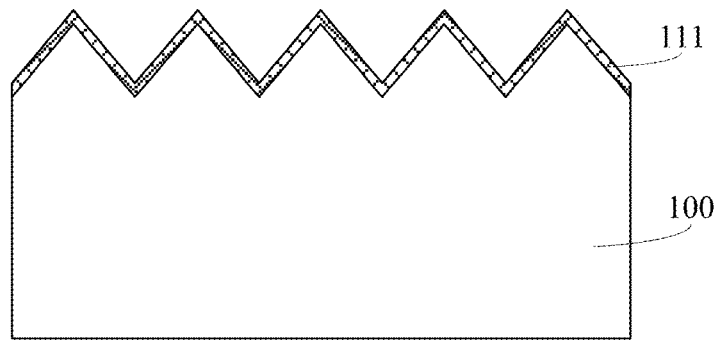

Referring to FIG. 8, a planarization process (for example, polishing) may be performed on the rear surface of the substrate 100.

The rear surface refers to a surface of the solar cell facing away from sunlight, and the planarization process may form a flat surface required for depositing a film on the rear surface. During the planarization process, the borosilicate glass at the rear surface is removed at the same time.

Figure 9:
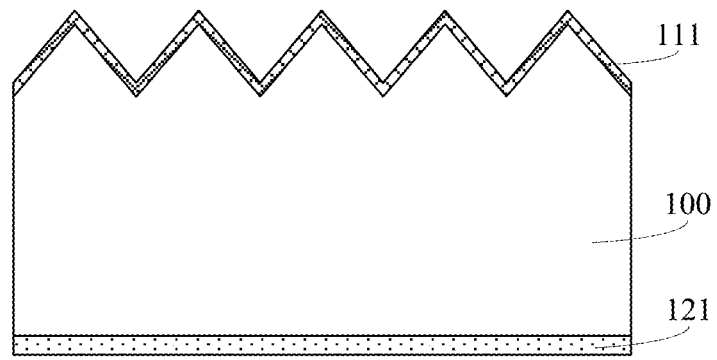
Figure 10:
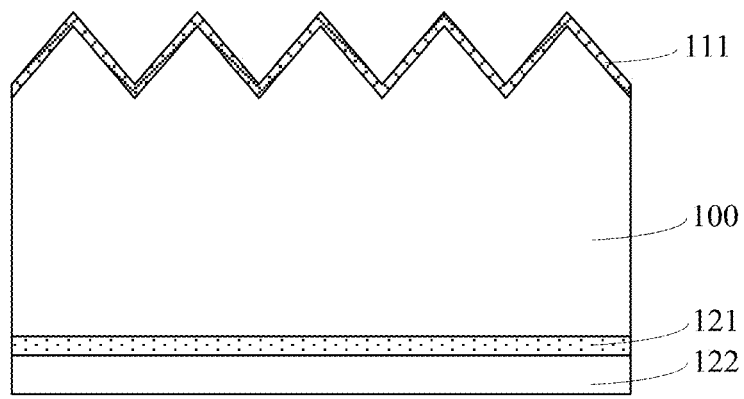

Referring to FIGS. 9 and 10, the interface passivation layer 121 and the field passivation layer 122 may be formed.

In some embodiments, the interface passivation layer 121 is disposed by a deposition process. A material of the interface passivation layer 121 includes silicon oxide, and the deposition process includes a chemical vapor deposition process. In other embodiments, the interface passivation layer may be formed by an in-situ formation process. The interface passivation layer may be formed on the silicon substrate in situ by processes such as a thermal oxidation process or a nitric acid passivation process.

In some embodiments, after forming the interface passivation layer 121, intrinsic polysilicon is deposited to form a polysilicon layer, and phosphorus ions are doped into the intrinsic polysilicon to form an N-type doped polysilicon layer by an ion implantation and source diffusion process, and the doped polysilicon layer serves as the field passivation layer 122.

When a deposition process is used to form the interface passivation layer 121 and the field passivation layer 122, since the front surface has the borosilicate glass as a mask layer to protect the front surface of the substrate 100, there is no need to limit the deposition area to the rear surface by an additional mask during the deposition process, and a further process may be adopted to remove the boric acid glass on the front surface as well as the silicon oxide and polysilicon deposited on the front surface at the same time. In this way, no additional mask is required, which is conducive to reducing process steps, shortening process flow, and reducing cost.

In other embodiments, when the interface passivation layer is formed by an in-situ generation process, only polysilicon is deposited on the borosilicate glass on the front surface of the substrate.

Figure 11:
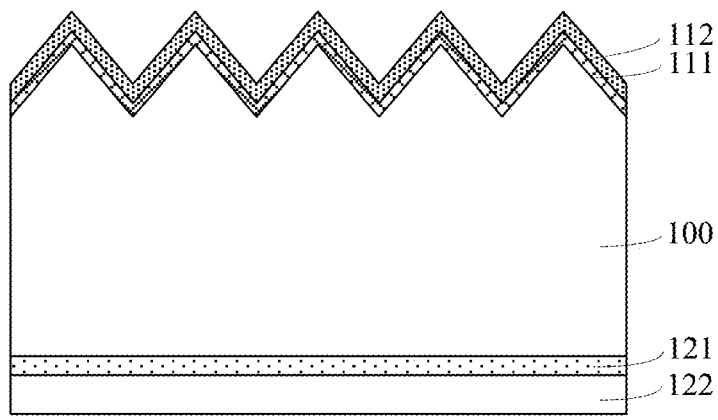

Referring to FIG. 11, a first passivation layer 112 may be formed on the front surface of the substrate 100.

In some embodiments, before forming the first passivation layer 112, it is required to remove the unwanted borosilicate glass, silicon oxide, and polysilicon on the front surface of the substrate 100. In other embodiments, before forming the first passivation layer, it is required to remove the unwanted borosilicate glass and polysilicon plated on the front surface of the substrate.

In other embodiments, after removing the unwanted material, a thin silicon oxide layer is grown on the front surface of the substrate. The formation process for the thin silicon oxide layer includes a natural oxidation process, a thermal oxidation process, a wet oxidation process, an atomic layer deposition process, or a plasma enhanced chemical vapor deposition process, etc. A thickness of the thin silicon oxide layer is 0~3 nm in the direction perpendicular to the substrate surface, such as 1 nm, 1.5 nm or 2 nm.

In some embodiments, the first passivation layer 112 includes a first silicon oxynitride ($SiO_xN_y$) material. In the first silicon oxynitride ($SiO_xN_y$) material of the first passivation layer 112, the number x of oxygen atoms and the number y of nitrogen atoms has a first ratio x/y of 1.5~3, to meet the charge characteristic requirements of the first passivation layer 112. Optionally, the first ratio may be 1.53~2.58, such as 1.86, 2.13, or 2.35. The silicon oxynitride with the atomic ratio range exhibits weak electropositivity.

The first passivation layer 112 may be formed by a chemical vapor deposition process, a plasma enhanced chemical vapor deposition process, or a magnetron sputtering process. The chemical vapor deposition process includes a low pressure chemical vapor deposition process, and the plasma enhanced chemical vapor deposition process includes a direct plasma deposition process and a remote plasma deposition process. The first passivation layer 112 deposited by the plasma chemical vapor deposition process or the like has a characteristics of relatively dense structure and may resist a migration of $Na^+$ ions by a physical barrier.

In some embodiments, after the first passivation layer 112 is formed, ammonia gas is introduced into the reaction chamber (e.g., the reaction chamber of PECVD device) and ionized to form ammonia gas plasma, and then hydrogen ions and nitrogen ions are implanted into the first passivation layer 112. In some embodiments, during the process, a flow rate of the ammonia gas is 6000 sccm~8000 sccm, such as 6500 sccm, 7000 sccm or 7500 sccm, a continuous introducing duration of the ammonia gas is 5 min-10 min, such as 6 min, 7 min or 8 min, and a radio frequency power applied to the ionizing is 4000 W~8000 W, for example 5000W, 6000 W or 7000 W.

In some embodiments, by implanting hydrogen ions into the first passivation layer 112, the hydrogen ions may migrate to the surface of the substrate 100, thereby passivating the interface defects between the substrate 100 and the first passivation layer 112, and improving the passivation effect of the first passivation layer 112. In addition, by implanting nitrogen ions into the first passivation layer 112, nitrogen-rich silicon oxynitride may be formed at a region neighboring the surface of the first passivation layer 112 away from the substrate 100. Specifically, in the direction of the first passivation layer 112 toward the substrate 100, the ratio of the number of nitrogen atoms and the number of oxygen atoms, that is, a ratio of m/n in the first silicon oxynitride ($Si_mN_n$) decreases, and the distribution of the nitrogen-rich silicon oxynitride is conducive to improving the lattice matching between the first passivation layer 112 and a second passivation layer formed subsequently. The second passivation layer covers the surface of the first passivation layer 112 and uses silicon nitride as the main raw material to improve the passivation effect of the first passivation layer 112.

In some embodiments, the same ion implantation process may be used to simultaneously implant hydrogen ions and nitrogen ions with the same implantation power. Since a mass of nitrogen ions is greater than that of hydrogen ions, a range of nitrogen ions is smaller than that of hydrogen ions. Using the same implantation power to simultaneously implant hydrogen ions and nitrogen ions, it may realize that nitrogen ions are concentrated at a first region neighboring a first surface of the first passivation layer 112 far away from the substrate 100 and hydrogen ions are concentrated at a second region neighboring a second surface of the first passivation layer 112 close to the substrate 100 (the second surface being opposite to the first surface), thereby improving the lattice matching degree between the first passivation layer 112 and the second passivation layer, and reducing the grain boundary defects between the substrate 100 and the first passivation layer 112, further improving the passivation effect of the first passivation layer 112 and the photoelectric conversion efficiency of the solar cell.

In addition, the ion implantation of nitrogen ions and hydrogen ions may also be achieved through a heat treatment process in nitrogen-hydrogen mixed atmosphere (Forming gas annealing, FGA).

Figure 12:
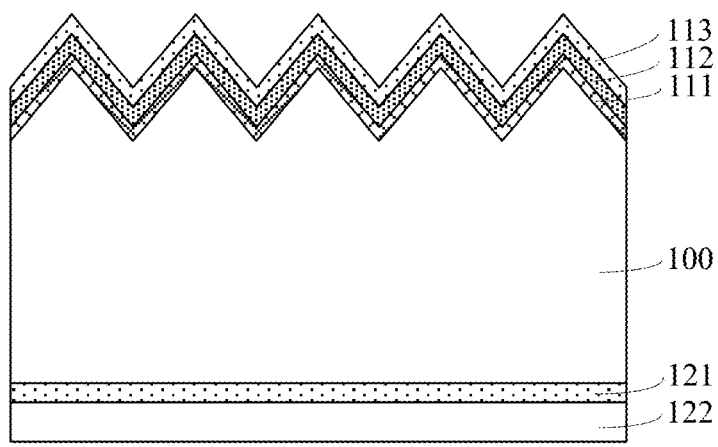

Referring to FIG. 12, a second passivation layer 113 on the surface of the first passivation layer 112 may be formed.

In some embodiments, the second passivation layer 113 includes a first silicon nitride ($Si_mN_n$) material, where m>n. The second passivation layer 113 may be generated by a reaction of silane and ammonia gas. A specific process includes a chemical vapor deposition process, a plasma enhanced chemical vapor deposition process or a magnetron sputtering process. The chemical vapor deposition process includes a low pressure chemical vapor deposition process. The plasma enhanced chemical vapor deposition process includes a direct plasma deposition process and a remote plasma deposition process.

In some embodiments, the first passivation layer 112 and the second passivation layer 113 are generated by using a same process equipment, and it is not required to form an aluminum oxide layer by using an additional equipment, which is conducive to reducing facility cost.

Figure 13:
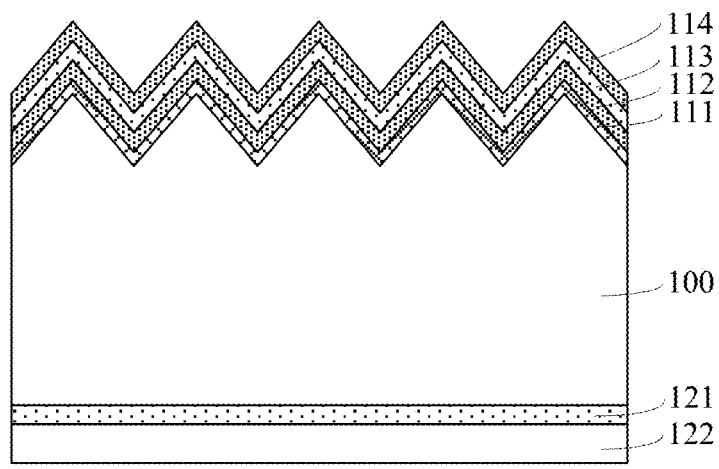

Referring to FIG. 13, a third passivation layer 114 on a surface of the second passivation layer 113 may be formed.

In some embodiments, the third passivation layer 114 includes a second silicon oxynitride ($SiO_iN_j$) material, where i/j∈[0.97, 7.58]. The second silicon oxynitride material may be generated by a reaction of silane, nitrous oxide, and ammonia gas. A specific process may be a chemical vapor deposition process, a plasma enhanced chemical vapor deposition process or a magnetron sputtering process. The chemical vapor deposition process includes a low pressure chemical vapor deposition process. The plasma enhanced chemical vapor deposition process includes a direct plasma deposition process and a remote plasma deposition process.

Figure 14:
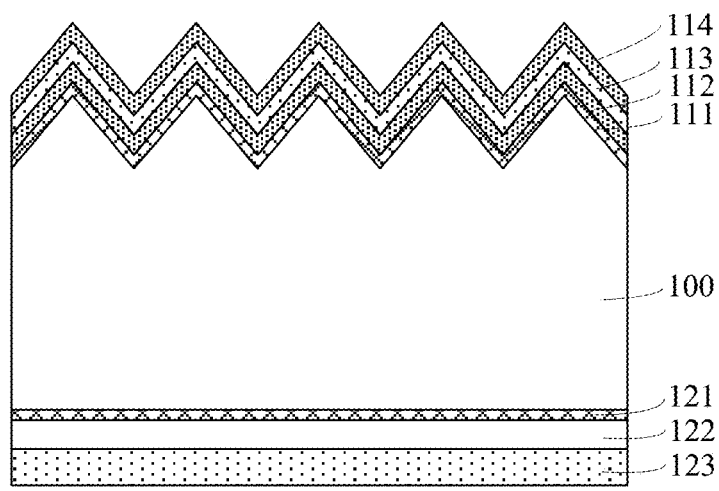

Referring to FIG. 14, a fourth passivation layer 123 may be formed on a surface of the field passivation layer 122 away from the substrate 100.

In some embodiments, the fourth passivation layer 123 may include a plurality of sub-layers, such as 2 to 4 layers. In the direction of the fourth passivation layer 123 toward the substrate 100, the refractive indexes of the plurality of sub-layers increase. In this way, it is conducive to improving the anti-reflection effect of the solar cell, so that the rear surface of the solar cell is black. In other embodiments, the fourth passivation layer has uniform refractive index at different positions.

In some embodiments, first electrodes 115 and second electrodes 124 may be formed.

After the fourth passivation layer 123 is formed, a metallization process is performed, optionally including a screen printing process and a high-temperature sintering process, to form the first electrodes 115 connected to the P-type emitter 111 and the second electrodes 124 connected to the field passivation layer 122.

In some embodiments, after the electrodes are formed, a photo-thermal annealing treatment is performed for the cell. In some embodiments, the treatment includes: placing the cell in a 400° C.~700° C. environment to preheat for 1 min~6 min, and then performing an annealing treatment for the solar cell for 1 min~6 min under a temperature environment of 150° C.~400° C. and 1-6 times of sunlight intensity. The annealing treatment under the above-mentioned temperature environment and light intensity may effectively increase the crystal grain size of the cell while shortening the annealing treatment time. The photo-thermal annealing treatment may further adjust the morphology and size of the grains of the film, and reduce stress in different film layers and between the different film layers. In this way, it enables to reduce an internal defect density and an interlayer interface defect density without using an aluminum oxide passivation system, reduce an interface recombination rate of carriers and guarantee effective transmission of carriers, so that the solar cell has relatively high photoelectric conversion efficiency.

In some embodiments, by controlling the composition ratio of the first silicon oxynitride ($SiO_xN_y$) material of the first passivation layer, the first passivation layer exhibits weak electropositivity and serves as a buffer layer, which may reduce an influence of the second passivation layer having strong electropositivity on the P-type emitter and thus match with the P-type emitter. Moreover, compared with the aluminium oxide, the silicon oxynitride has similar properties with the substrate, which is conducive to reducing the interface state defect density and stress damage of the P-type emitter, thereby reducing the carrier recombination rate at the front surface of the substrate, and improving the photoelectric conversion efficiency of the solar cell. Further, the first passivation layer with electropositivity may repel the positive ions that migrate in, prevent the positive ions from migrating to the surface of the substrate, which is conducive to suppressing the PID phenomenon of solar cells and improving the performance of the module.

In addition, by providing the first passivation layer having the certain thickness, it is conducive to reducing the front light trapping loss introduced by the first passivation layer. In addition, by providing first passivation layer having the certain refractive index, the number of positive charges of the first passivation layer is kept in a proper range, which not only ensures that the first passivation layer has a good repelling effect on the migrated positive ions for inhibiting the PID phenomenon, but also ensures that the first passivation layer may be used for the surface passivation of the P-type emitter. Further, it is conducive to controlling the stress between the first passivation layer and the substrate within a reasonable range, which not only ensures the effective bonding between the first passivation layer and the substrate, but also reduces the stress damage to the substrate.

Those skilled in the art should appreciate that the aforementioned embodiments are specific embodiments for implementing the present disclosure. In practice, however, various changes may be made in the forms and details of the specific embodiments without departing from the spirit and scope of the present disclosure. Any person skilled in the art may make their own changes and modifications without departing from the spirit and scope of the present disclosure, so the protection scope of the present disclosure shall be subject to the scope defined by the claims.

What is claimed is:

1. A solar cell, comprising:
an N-type substrate;
a P-type emitter formed at a front surface of the N-type substrate;
a first passivation layer, a second passivation layer and a third passivation layer sequentially formed over the front surface of the N-type substrate and in a direction away from the P-type emitter; wherein the first passivation layer comprises a first silicon oxynitride (Si$O_xN_y$) material, wherein x>y; the second passivation layer comprises a first silicon nitride (Si$_m$N$_n$) material, wherein m>n; and the third passivation layer comprises a second silicon oxynitride (SiO$_i$Nj) material, wherein a first ratio of x/y is in a range of 2.13 to 3, a second ratio of m/n is in a range of 3 to 5.41, and a third ratio of i/j is in a range of 2.5 to 7.58, wherein the first passivation layer has a thickness of 18 nm~20 nm in a direction perpendicular to the N-type substrate, and the third passivation layer has a thickness of 37 nm~50 nm in the direction perpendicular to the N-type substrate; and
a passivated contact structure formed on a rear surface of the N-type substrate, wherein the passivated contact structure at least comprises an interface passivation layer and a field passivation layer sequentially formed in a direction away from the N-type substrate.

2. The solar cell according to claim 1, wherein the second passivation layer has a thickness of 40 nm~60 nm in a direction perpendicular to the N-type substrate.

3. The solar cell according to claim 1, further comprising:
a fourth passivation layer on a surface of the passivated contact structure away from the N-type substrate, wherein a material of the fourth passivation layer comprises a second silicon nitride (Si$_a$N$_b$) material, wherein a fourth ratio of a/b is 3.82~6.37.

4. The solar cell according to claim 3, wherein a refractive index of the fourth passivation layer is 2.04~2.2, and the fourth passivation layer has a thickness of 60 nm~100 nm in a direction perpendicular to the rear surface of the N-type substrate.

5. A solar module, comprising at least one solar cell, wherein the at least one solar cell each comprises:
an N-type substrate;
a P-type emitter formed at a front surface of the N-type substrate;
a first passivation layer, a second passivation layer and a third passivation layer sequentially formed over the front surface of the N-type substrate and in a direction away from the P-type emitter; wherein the first passivation layer comprises a first silicon oxynitride (Si$O_xN_y$) material, wherein x>y; the second passivation layer comprises a first silicon nitride (Si$_m$N$_n$) material, wherein m>n; and the third passivation layer comprises a second silicon oxynitride (SiO$_i$N$_j$) material, wherein a first ratio of x/y is in a range of 2.13 to 3, a second ratio of m/n is in a range of 3 to 5.41, and a third ratio of i/j is in a range of 2.5 to 7.58; wherein the first passivation layer has a thickness of 18 nm~20 nm in a direction perpendicular to the N-type substrate, and the third passivation layer has a thickness of 37 nm~50 nm in the direction perpendicular to the N-type substrate; and
a passivated contact structure formed on a rear surface of the N-type substrate, wherein the passivated contact structure at least comprises an interface passivation layer and a field passivation layer sequentially formed in a direction away from the N-type substrate.

6. The solar cell according to claim 1, wherein the first passivation layer and the P-type emitter have same charge polarity.

7. The solar cell according to claim 1, wherein a first refractive index of the first passivation layer is 1.61~1.71, a second refractive index of the second passivation layer is 1.98~2.2, and a third refractive index of the third passivation layer is 1.56~1.87.

8. The solar cell according to claim 1, wherein the second passivation layer comprises a plurality of sub-layers, and refractive indexes of the plurality of sub-layers increase in a direction from the second passivation layer toward the substrate.

9. The solar cell according to claim 1, wherein a ratio of the third ratio of i/j to the first ratio of x/y is in a range of 0.57 to 4.95.

10. The solar module according to claim 5, wherein the second passivation layer has a thickness of 40 nm~60 nm in a direction perpendicular to the N-type substrate.

11. The solar module according to claim 5, wherein a first refractive index of the first passivation layer is 1.61~1.71, a second refractive index of the second passivation layer is 1.98~2.2, and a third refractive index of the third passivation layer is 1.56~1.87.

12. The solar module according to claim 5, wherein the second passivation layer comprises a plurality of sub-layers, and refractive indexes of the plurality of sub-layers increase in a direction from the second passivation layer toward the substrate.

13. The solar module according to claim 5, wherein a ratio of the third ratio of i/j to the first ratio of x/y is in a range of 0.57 to 4.95.

14. The solar module according to claim 5, wherein each of the at least one solar cell further comprises:
a fourth passivation layer on a surface of the passivated contact structure away from the N-type substrate, wherein a material of the fourth passivation layer comprises a second silicon nitride (Si$_a$N$_b$) material, wherein a fourth ratio of a/b is 3.82~6.37.

15. The solar module according to claim 14, wherein a refractive index of the fourth passivation layer is 2.04~2.2, and the fourth passivation layer has a thickness of 60 nm~100 nm in a direction perpendicular to the rear surface of the N-type substrate.

* * * * *